(12) United States Patent
Kanda

(10) Patent No.: US 6,867,845 B2
(45) Date of Patent: Mar. 15, 2005

(54) MASK AND PROJECTION EXPOSURE APPARATUS

(75) Inventor: Tsuneo Kanda, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/033,081

(22) Filed: Dec. 27, 2001

(65) Prior Publication Data

US 2002/0086224 A1 Jul. 4, 2002

(30) Foreign Application Priority Data

Dec. 28, 2000 (JP) .......................... 2000-401228

(51) Int. Cl.$^7$ .................. G03B 27/68; G03B 27/42; G03B 27/32; G03F 9/00
(52) U.S. Cl. .................. 355/52; 355/53; 355/77; 430/5
(58) Field of Search .................. 355/52, 53, 77; 430/5, 322, 323, 324

(56) References Cited

U.S. PATENT DOCUMENTS

| | | | |
|---|---|---|---|
| 5,739,899 A | * | 4/1998 | Nishi et al. .................. 355/53 |
| 6,268,902 B1 | | 7/2001 | Mori .......................... 355/52 |
| 6,522,386 B1 | * | 2/2003 | Nishi .......................... 355/52 |
| 6,545,829 B1 | * | 4/2003 | Boettiger et al. ........... 359/888 |
| 6,627,365 B1 | * | 9/2003 | Shiraishi .................... 430/30 |
| 2001/0004508 A1 | * | 6/2001 | Shirasaki ..................... 430/5 |

FOREIGN PATENT DOCUMENTS

| | | |
|---|---|---|
| EP | 1158361 A1 | 11/2001 |
| JP | 4-130711 | 5/1992 |
| JP | 7-29803 | 1/1995 |
| JP | 2001-117213 | 4/2001 |

OTHER PUBLICATIONS

An English translation of a Notice of Rejection mailed May 27, 2003, for Japanese Application No. 2001–401228; (discussing JP Application No. 2000–49802).

* cited by examiner

*Primary Examiner*—Alan Mathews
(74) *Attorney, Agent, or Firm*—Morgan & Finnegan, LLP

(57) ABSTRACT

There is to provide a mask including a transparent member at a side of a surface of a base, a pattern being formed on the surface, and a correction part for correcting a change in an optical path of the transparent member.

18 Claims, 7 Drawing Sheets

MASK AND PROJECTION EXPOSURE APPARATUS

BACKGROUND OF THE INVENTION

The present invention relates to masks and projection exposure apparatuses, in particular, those suitable for a photolithography process for fabricating various devices including semiconductor devices such as ICs and LSIs, image pick-up devices such as CCDs, display devices such as liquid crystal panels, and magnetic heads.

A photolithography process for fabricating semiconductor devices uses a projection exposure apparatus to transfer a circuit pattern formed on a reticle or photo mask (called "a mask" hereinafter), onto a photosensitive material applied semiconductor wafer (or a photosensitive plate). Importantly, the projection exposure apparatus needs to use such a projection optical system as exhibits excellent image-forming performance with small aberration, so as to transfer the mask pattern onto the wafer under specified magnifications (reduction rate) with high accuracy. A recent demand on smaller semiconductor devices has accordingly required the image-forming performance to transfer a pattern more minute than was expected in a conventional projection optical system.

Improvements of the resolution for conventional projection exposure apparatuses include use of an increased NA in a projection optical system with a fixed wavelength of exposure light, and a shortened exposure wavelength, for example, from the g line through the i line to an excimer laser beam (with a wavelength of 300 nm or less). More recent approaches use of a phase shift mask and a modified illumination to mitigate limits on the exposure resolution.

A shorter exposure wavelength narrows or limits a scope of materials usable for the projection optical system in view of cost and performance, such as transmittance, durability, etc.

Thus, projection lenses used for exposure apparatuses in the generation after, for example, the ArF excimer laser (with a central wavelength of 193 nm) need to have a simple configuration which decreases the number of transmitting members. A projection optical system with a simple configuration would decrease the number of parameters at the time of lens adjustment, and accordingly would have a less freedom of adjustment. Therefore, it would become difficult to attain a high performance goal. On the other hand, as the miniaturization advances, projection lenses with a higher performance than ever are needed, and the difficulty of the projection lens fabrication for the shortened exposure wavelength is drastically increasing.

In the meanwhile, a mask used in the projection exposure apparatus is provided with a pellicle film (or particle-proof film), i.e., a dustproof transparent member so that foreign particles such as dirt and dust may not adhere to a circuit pattern surface. This helps to improve a yield of products.

The pellicle film is one of those members which have the above problems with the shortened exposure wavelength. One proposed solution for this problem is to use a plane parallel plate of glass material with a given thickness, not a film, using the conventional materials.

However, a transparent member of such a plane parallel plate would flex because of its own weight when applied to an exposure apparatus, and a pattern (a circuit pattern image) projected by a projection optical system would include various aberrations, especially, a distortion, due to a transformation by transparent member's own weight. Typically, since such a dustproof transparent member is fixed to a mask via a rectangular frame, a flexure distribution in a plane of this transparent member will be as shown in FIG. 3. FIG. 3 shows numeric representation of a flexure in each area. FIG. 3 shows the shape of a pellicle associated with an exposure area of a ¼ fold reduction scanner (that is a scanning projection exposure apparatus having a magnification of the projection optical system of ¼), its size being 104 mm×132 mm with a thickness of 200 μm, and a vertical interval between its top and bottom being approximately 34 nm. A distortion caused by these flexures is as shown in FIG. 4, and even if a correction using an approach proposed in Japanese Laid-Open Patent Application No. 4-130711, a rotationally symmetrical error component could be corrected, but a certain amount of components would remain uncorrected as shown in FIG. 5.

The distortion correction mechanism proposed in the above reference is one mechanism in a projection exposure apparatus, which changes the pressure in the air chamber in the projection lens, and corrects a change in projection optical system's magnification based on the transformation (flexure) of the dustproof transparent member and that a wafer surface follows a post-fluctuation focal point in relation to the fluctuation in the focal point of the projection optical system based on the transformation.

On the other hand, if a circuit pattern written onto a mask plate is deviated from a design value of the circuit (or an ideal circuit pattern), it would result in a transfer of a distorted circuit onto the wafer. Accordingly, the projection exposure apparatus including a means for correcting deviances (writing errors) of the circuit pattern written on the mask from the design values is proposed in Japanese Laid-Open Patent Application No. 7-29803.

BRIEF SUMMARY OF THE INVENTION

It is an object of the present invention to provide a mask and a projection exposure apparatus that may effectively prevent or decrease deterioration of image quality (quality of a circuit pattern image) based on a dustproof transparent member and/or circuit pattern writing errors.

A mask of one aspect of the present invention includes a base having a pattern e.g., a circuit pattern, formed on a surface, a transparent member provided at the side of a surface of the base, a pattern, and a correction part for correcting a change in an optical path by the transparent member.

A mask of another aspect of the present invention includes a correction part for correcting a writing error of a pattern.

A mask of another aspect of the present invention includes a base having a pattern formed on a surface, a transparent member provided at a side of the surface of the base, and a correction part for correcting a change in an optical characteristic due to a transformation of the transparent member.

A mask of another aspect of the present invention includes a base having a pattern formed on a surface, a transparent member provided at a side of the surface of the base and a correction part, provided in the transparent member, for correcting a writing error of the pattern.

A mask of another aspect of the present invention includes a base having a pattern formed on a surface, a transparent member provided at a side of the surface of the base and a correction part for correcting a writing error of the pattern and a change in an optical characteristic due to a transformation of the transparent member.

A mask of another aspect of the present invention includes a base having a pattern formed on a surface, a dustproof transparent member provided at a side of the surface of the base and an aspheric surface provided at least one of planes of incidence and exit of light in the transparent member.

The transparent member may have a dustproof function, and the correction part has an aspheric surface. The aspheric surface may be formed onto the transparent member at a side of the base. The correction part may be formed by an aspheric surface formed by a mechanical process to transparent member's surface or formed by vacuum evaporation. The transformation of the transparent member may result from a transformation of transparent member's own weight and/or a stress generated when the transparent member is attached to a frame. The transparent member may be attached to the base through a frame. The base and the transparent member may be made of quarts or fluorite. The quarts may be a fluorine doped quartz.

The correction part may be formed such that a ray emits to a proper optical path from each portion in the pattern. The correction part may be formed such that a distortion of an image of the pattern is reduced when the image of the pattern is projected by a projection optical system in an exposure apparatus when the mask is installed into the exposure apparatus.

A device fabrication method of another aspect of the present invention includes the steps of exposing a photosensitive body by using a projection optical system to project a pattern on a mask onto the photosensitive body, the mask including a transparent member at a side of a surface of a base, a pattern being formed on the surface, and a correction part for correcting a change in an optical path by the transparent member, and developing the photosensitive body that has been exposed.

A projection exposure apparatus of another aspect of the present invention includes a mask stage for installing the mask, the mask including a transparent member at a side of a surface of a base, a pattern being formed on the surface, and a correction part for correcting a change in an optical path by the transparent member, an illumination optical system for illuminating the mask, and a projection optical system for projecting the pattern on the mask illuminated by the illumination optical system, the mask stage and the illumination and projection optical systems being configured such that the pattern on the mask may be projected.

The illumination optical system may use light having a wavelength of 200 nm or smaller to illuminate the mask. The light may be fed from an ArF or $F_2$ excimer laser unit. The projection exposure apparatus may further include a mechanism for adjusting a symmetrical distortion of the projection optical system.

The projection exposure apparatus may further include a mechanism for adjusting a spherical aberration of the projection optical system. The adjusting mechanism may reduce a correction amount for a spherical aberration due to the transparent member.

The projection optical system is a telecentric optical system at both object and image sides.

Other objects and further features of the present invention will become readily apparent from the following description of the preferred embodiments with reference to accompanying drawings.

DETAILED DESCRIPTION OF THE PREFERRED EMBODIMENTS

Figure 1:
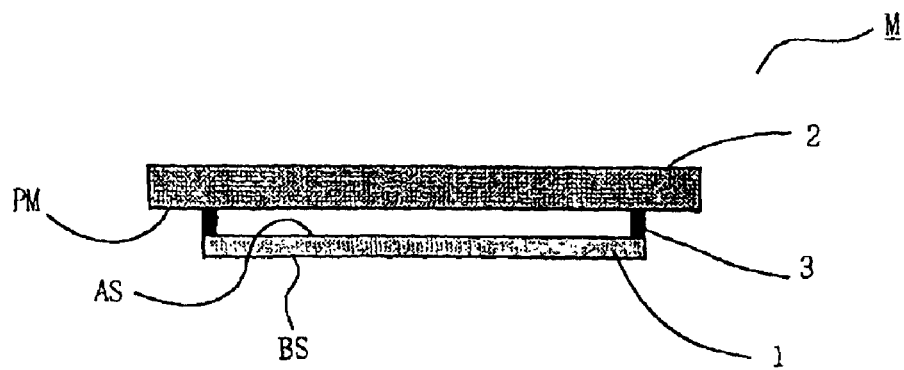
FIG. 1 is a sectional view of main parts of a mask in a first embodiment of the present invention.

FIG. 1 shows a sectional view of main parts of a mask (also called a reticle) of the first embodiment according to the present invention.

In FIG. 1, the mask M includes members 1, 2, and 3. 2 denotes mask M's plate or base, and when it is incorporated into a projection exposure apparatus, a pattern (or a circuit pattern) is written on a surface at a side of the projection optical system (typically, bottom surface) PM.

1 denotes a dustproof transparent member (particle-proof member, i.e., pellicle) for preventing a foreign material from adhering to the pattern surface PM of the plate 2, and is supported by a supporting frame 3 attached to the mask plate 2 at a side of the (pattern) surface PM. The transparent member 1 and mask plate 2 are made of any glass material (including fluorine doped quartz and fluorite) transparent to light with a wavelength of 100–200 nm.

An aspheric surface is built on a surface AS at plate 2's side of the transparent member 1. The aspheric surface serves as a correction means for correcting various types of aberrations in a pattern image, particularly distortions, when the mask M having the transparent member 1 is installed into a projection exposure apparatus to project the pattern image on the mask M onto a wafer. The aberrations are generated by a shifted optical path for an imaging beam from a proper optical path due to transformations by transparent member 1's own weight or by a stress generated when it is attached onto the supporting frame. The correction means also corrects (writing) errors of the circuit pattern deviating from a design values, the circuit pattern being written on the surface PM of the plate 2 by using an electron beam exposure system.

If the correction means is provided on the plane of incidence of light AS, it is preferably easy to wipe off foreign particles clinging to a plane of exit of light BS as its opposite surface. The surface BS may be provided with an aspheric surface as necessary, or an aspheric surface may be provided on both the surfaces AS and BS. When an aspheric surface is provided on the surface BS, a reprocess of the aspheric surface would become easy. As a correction means, the surface AS of the transparent member 1 may be of a rotationally symmetrical or asymmetrical aspheric shape. A method of building a correction means may include an aspheric process of the surfaces AS and BS, and a bond of a thin film etc. having an aspheric surface onto the surfaces AS and BS.

This embodiment uses a correction means, formed by a spherical or aspheric process on a surface AS at the side of the plate 2 of the transparent member 1 made of a glass material, to deflect the optical path of an imaging beam from mask M's pattern into its proper path and correct it to the proper optical path, thereby correcting a distortion due to a transformation caused by transparent member 1's own weight and/or a distortion based on errors of writing the pattern on the mask M. As a result, the projection lens images the circuit pattern without fail, and a mask and a projection exposure apparatus obtain the high image quality (i.e., a high quality pattern image with no distortion).

In attaching the dustproof transparent member 1 to the plate 2, the transparent member 1 may be directly bonded onto the plate 2 rather than through the frame 3. Also, when an ordinary thin pellicle is used, or a thick and heavy pellicle is made of the same material as the thin pellicle, and if there is a problem of deteriorating image quality (quality of the pattern image) because of a solution of this invention is applicable to any transformation of the pellicle due to its own weight or a pattern writing error.

Figure 2:
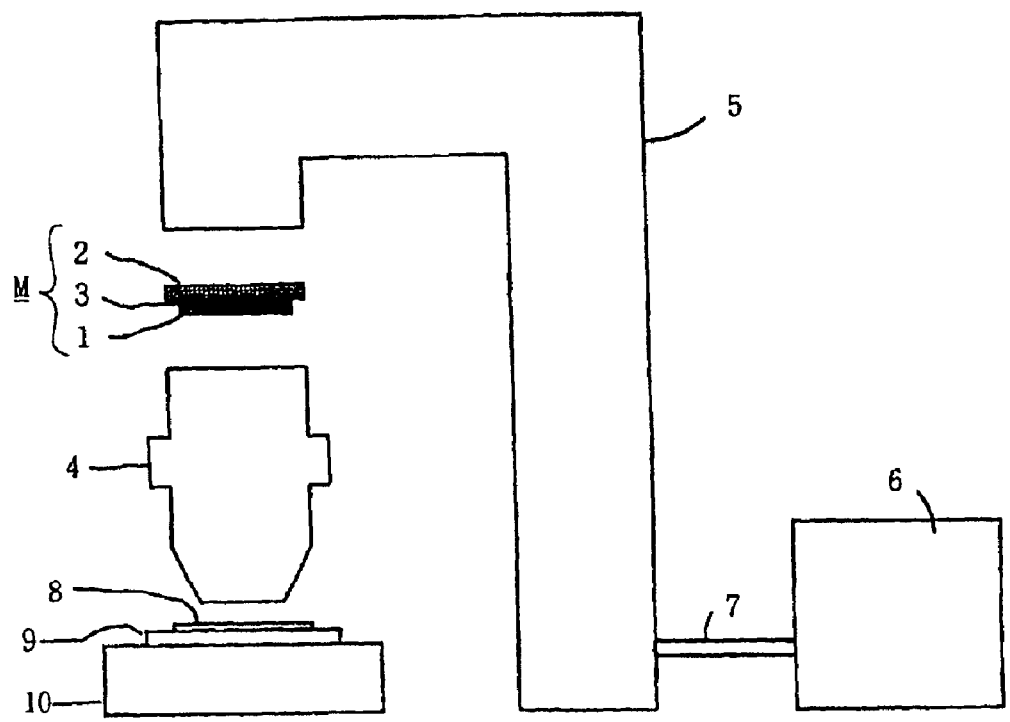
FIG. 2 is a schematic view of a projection exposure apparatus in a second embodiment of the present invention.

FIG. 2 is a schematic view a projection exposure apparatus of the second embodiment of the present invention.

According to the present embodiment, the present invention is applicable to a step-and-repeat and step-and-scan projection exposure apparatuses used in fabricating devices such as semiconductor devices, liquid crystal devices, imaging devices, magnetic heads, and the like.

A projection exposure apparatus in this embodiment includes a mask stage (not shown) for mounting various types of masks, an illumination optical system 5 for illuminating these masks, and an projection optical system 4, both the object and image sides of which are telecentric, for projecting a circuit pattern on the illuminated mask onto a wafer 8. The mask stage and each of the optical systems 4 and 5 are configured such that one of the masks M discussed in the first embodiment may be mounted and the circuit pattern on the mask M may be projected.

The illumination optical system 5 receives a laser beam with a wavelength of 200 nm or less from an excimer laser (unit) 6 as a light source through a light guide path, and after turning this laser beam into an incoherent one and making the sectional intensity distributions uniform, illuminates the mask with an illumination beam having a sectional shape corresponding to the shape of the pattern area on the mask. The excimer laser 6 is an ArF excimer laser (with an oscillating wavelength of 193 nm and a half-value width of 0.6 pm or less) or $F_2$ excimer laser (with an oscillating wavelength of 157 nm and a half-value width of 0.2 or less) which is capable of pulse or continuous oscillation.

The projection optical system 4 includes a known mechanism for adjusting a symmetrical distortion in the projection optical system 4, and a known mechanism for adjusting a spherical aberration in the projection optical system 4, and thus can use these mechanisms to correct or decrease spherical aberrations and symmetrical distortions generated in the transparent member 1 of the mask M. Further, the projection optical system 4 includes a dioptric or catadioptric system, and projects onto the wafer W a reduced image representative of a circuit pattern on the mask M. A lens unit for this optical system 4 is made of quartz and/or fluorite.

A step-and-repeat exposure apparatus uses the projection optical system 4 to project and transfer, at one time, a reduced image of the entire electronic circuit pattern written on the mask M for exposure every shot area on the wafer 8 which is suction-held by a wafer chuck 9 of an XY stage 10.

A step-and-scan exposure apparatus uses the illumination optical system 5 to illuminate the mask every shot area on the wafer 8, with an illumination beam having a rectangular or arc slit-shaped sectional shape. Then the illumination optical system 5 scans the mask and wafer 8 along a width direction of the sectionally slit shape of this illumination beam in a direction orthogonal to the optical axis of the projection optical system 4 but in a reverse direction to each other at the same velocity rate as the projection magnification of the projection optical system 4 to project and transfer a reduced image of the entire circuit pattern on the mask to be exposed onto the shot area of the wafer 8.

Figure 3:
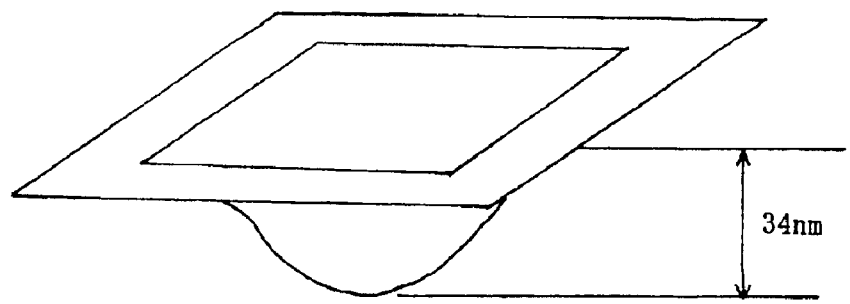
FIG. 3 is a view for explaining a transformation of a dustproof transparent member by its own weight according to the present invention.
Figure 4:
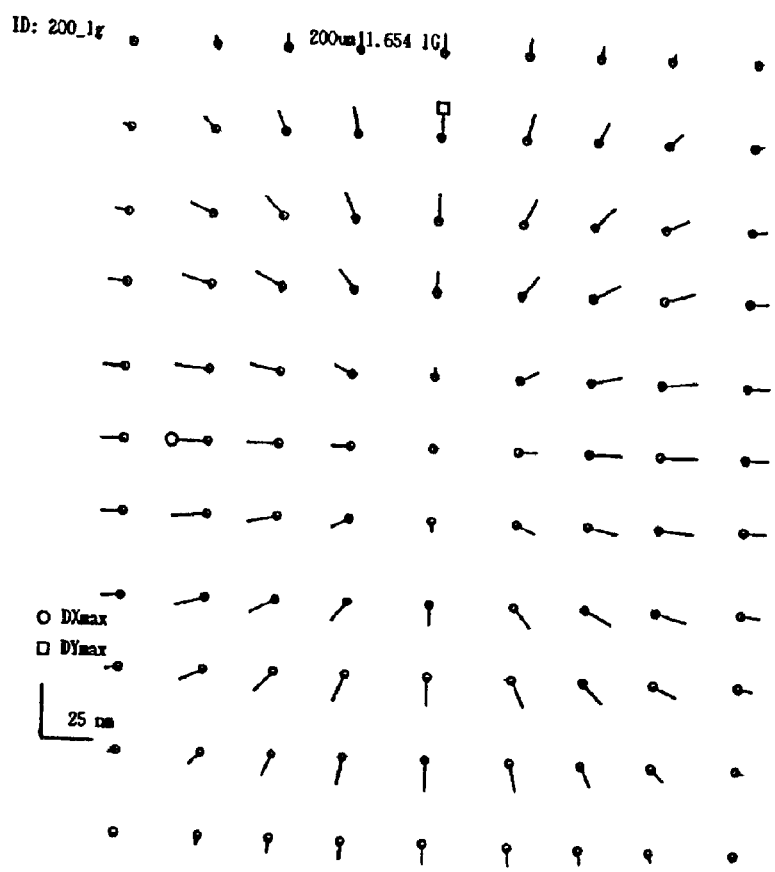
FIG. 4 is a view for explaining a position of a principal ray incident upon a wafer surface.

The dustproof transparent member 1 (pellicle) for the mask M in the first and second embodiments utilizes a plane parallel plate having an ideal shape and a predetermined thickness. When the transparent member 1 is attached to the mask M (plate 2) and installed into the projection exposure apparatus as the mask M as shown, it will be transformed by its own weight depending on a glass type, thickness, size and holding method, and generate various types of aberrations, particularly, a distortion resulting from the transformation due to its own weight. For example, assuming transparent member 1's glass material is the quartz with a thickness of 200 $\mu$m, the transformation by its own weight is as shown in FIG. 3 without the above aspheric surface as a distortion correction means. FIG. 4 is a typical simulated diagram of the distortion arising from the weight transformation shown in FIG. 3.

Figure 5:
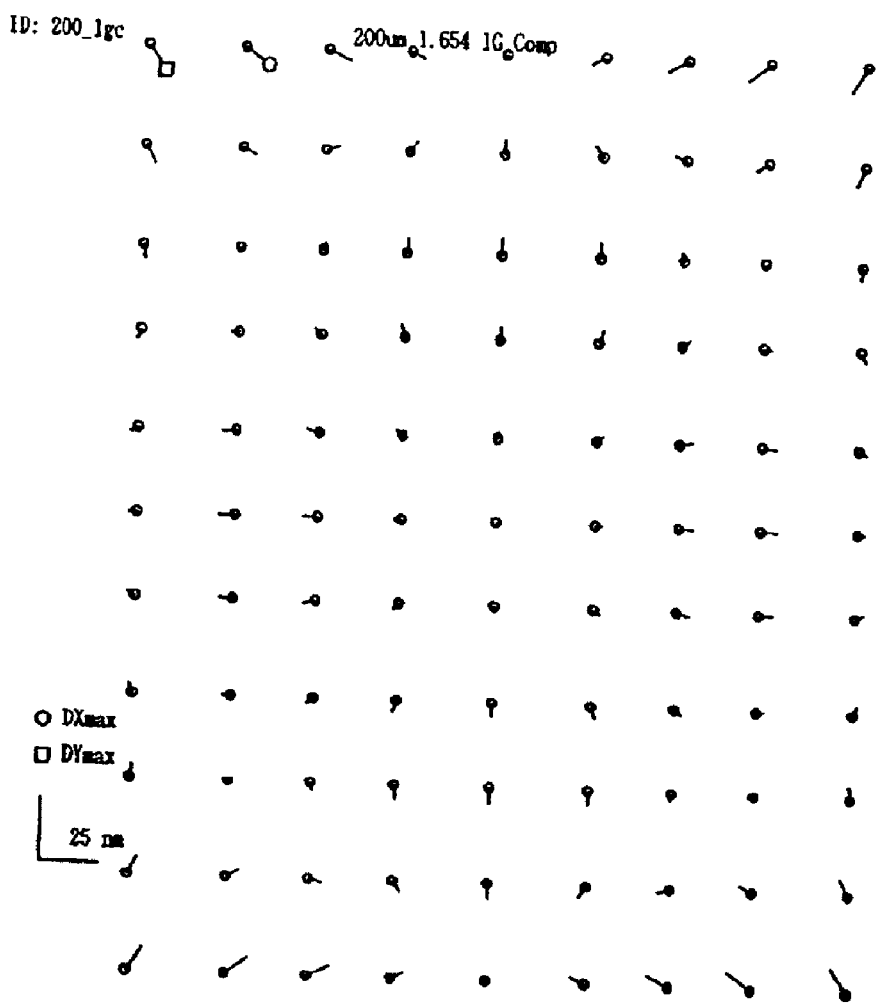
FIG. 5 is a view for explaining a position of a principal ray incident upon a wafer plane after a symmetrical distortion has been corrected for the mask shown in FIG. 4.

In FIG. 4, "a mark o" denotes a position of incidence (an ideal image point) at which a principal ray of an imaging beam enters the wafer 8, a principal ray emitting from each object point on the mask M's pattern surface PM, when the transparent member 1 has no transformation due to its own weight and thus no distortion. A tip position of a (straight) line emitting from "the mark o" indicates a position of incidence of each principal ray upon the surface of the wafer 8 when the weight transformation occurs as shown in FIG. 3 to the transparent member 1 and an optical path of each principal ray fluctuates. The longer this straight line is, the more distortion it includes. FIG. 5 is a view for explaining, in the same manner as FIG. 4, a position of the principal ray incident upon each position on the wafer surface when the projection optical system 4 includes the symmetrical distortion correction means and corrects those distortions shown in FIG. 4. Although the symmetrical distortions are improved as shown in FIG. 5, asymmetrical distortion components remain with an insufficient distortion correction. According to the first and second embodiments, an aspheric surface may correct these asymmetrical distortion elements as well as symmetrical distortions.

Figure 6:
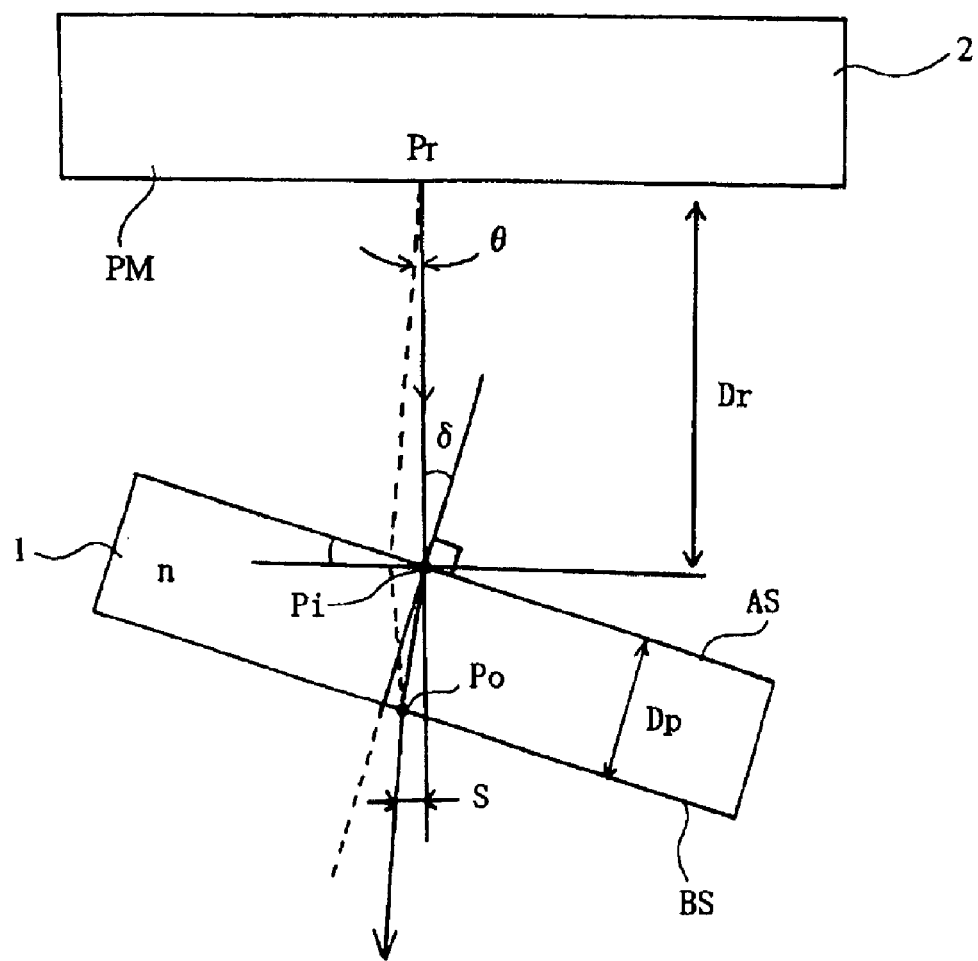
FIG. 6 is a view for explaining the way of correcting a distortion due to transparent member's transformation by its own weight.

The mask M according to the first and second embodiments uses a mechanical process to form an aspheric surface as a correction means for correcting the distortion on the surface AS on the transparent member 1 at the side of the plate 2. Referring to FIG. 6, a description will be given of a calculation of process guidance value for an aspheric surface process.

In FIG. 6, a shift amount S (corresponding that on the mask M) due to the weight transformation relative to a point of exit Po of a ray from the surface BS may be expressed as follows:

$$S = Dp \times \delta(1 - 1/n) \qquad (1)$$

where a distance between the pattern surface PM of the mask M's plate 2 and the surface AS of the transparent member 1 is Dr (including a flexure due to the weight transformation), a thickness of the transparent member 1 is Dp, a refractive index of a material constituting the transparent member 1 is n, and a slant of the transparent member 1's surface AS at the point of incidence Pi of the ray upon the surface AS is δ. Therefore, the principal ray shifts by S depending upon the flexure of the transparent member 1 (as much as the slant). Therefore, the shift amount from the weight transformation may be removed at the point of exit Po of the ray, when a plane angle is set such that the ray's angle θ satisfies the following equation:

$$\theta = S/(Dr + Dp) \quad (2)$$

In other words, the following angle X is calculated:

$$n\theta = \delta + X \quad (3)$$

In this way, the aspheric process to the surface AS positions a point Pr on an extended line of a beam LF that exits from the plane of exit BS of the transparent member 1.

This calculation is performed for multiple points on the plane of incidence AS of the transparent member to be processed, and calculated result X's for these multiple points are linked by a spline function. Then, a plane shape for the whole plane AS (aspheric shape) is determined.

As the fixed thickness, glass material, and holding method for the transparent member 1 would cause the same weight transformation, a similar shaped aspheric process may be used for each transparent member 1. Further, in attaching the transparent member to the mask M's plate 2, it is typically first attached to the frame 3. However, a certain stress arises depending upon the attachment to the transparent member 1, and transforms the transparent member 1, consequently generating a distortion accompanied by the transformation. The transformation at this time is due to the transparent member's own weight and the stress, and depends upon transparent member's thickness, shape, glass material, and frame shape. Therefore, when the frame size, bonding conditions, and specifications of the transparent member are determined, the shape would be the same for any transparent member. For this reason, by utilizing the above method to determine and process an aspheric shape in conformity with the transformation, a distortion due to the transparent member 1's transformation coming from the stress caused by attaching it to the frame may also be corrected as well as the distortion due to the weight transformation.

Thus, the distortion due to the transformation of the transparent member 1 by its own weight may be corrected by forming the aspheric surface on one side of the transparent member 1, and thus, it may be used in the same way as a conventional mask having a pellicle.

Aberrations arising from the transformation of the transparent member by its own weight include a coma aberration, astigmatic aberration, and the like in addition to the distortion, and all of them may be corrected by the same method.

According to the present embodiment, since the transparent member itself effectively corrects changes in various aberrations due to the transformation of the transparent member, another optical system (such as a projection optical system) for the correction is not always required.

A description will now be given of a mask of the third embodiment of the instant invention without reference to any drawing.

Compared to the mask in the first embodiment, the mask in the third embodiment mounts the dustproof transparent member directly onto the mask plate on which a pattern of an electronic circuit is written, without using the frame 3.

This reduces various aberrations due to the transformation of the transparent member by its own weight when the transparent member is applied to the projection exposure apparatus.

When a mask having no transparent member covering a pattern surface is mounted onto such a projection exposure apparatus for projection and exposure as uses a projection optical system designed and assembled for a mask having a transparent member covering a pattern surface, to project a pattern on the mask, an optical member that compensates for the thickness of the transparent member considered in the design may be inserted detachably in the optical path underneath the pattern surface.

A description will now be given of the fourth embodiment of this invention. In this embodiment, the coordinates for each part of an electronic circuit pattern written on the mask M's plate deviate from an actual design value with which to draw the pattern, thus generating errors. Thus, a correction means, such as an aspheric surface, corrects a writing error. The correction means is provided on at least one of planes of incidence and exit of the dustproof transparent member. Such an pattern writing error arises when the above lithography uses metal to form an electronic circuit pattern onto the glass plate, for example, when an electron beam exposure apparatus is used to write (EB writing) or expose an electronic circuit pattern.

Figure 7:
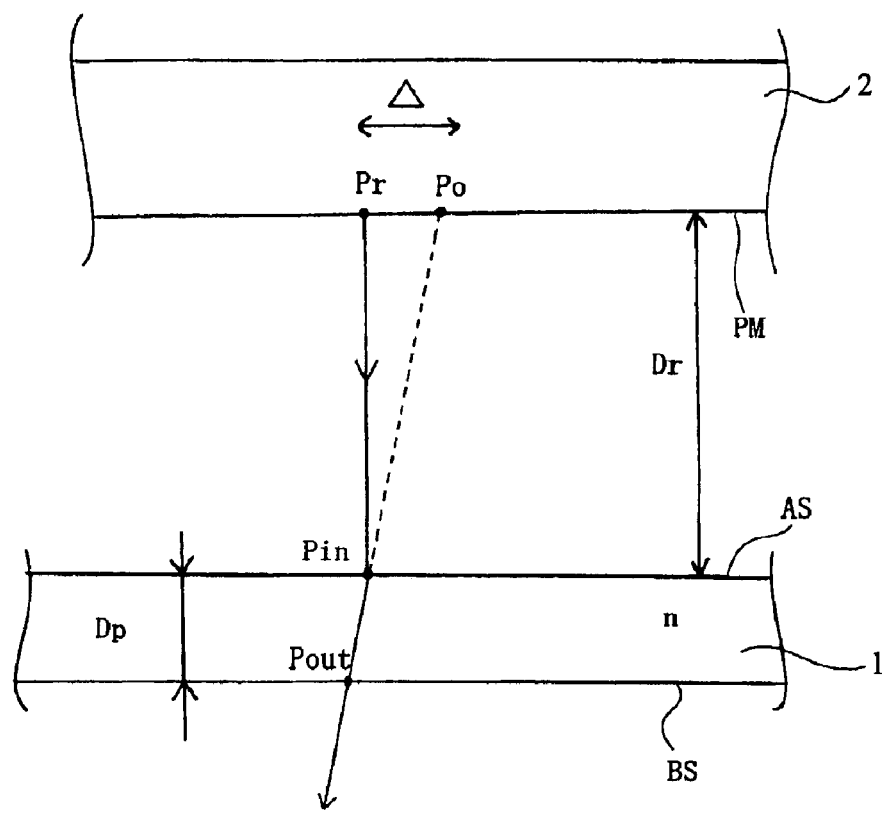
FIG. 7 is a view for explaining the way of correcting a distortion due to pattern writing errors.

FIG. 7 is a view for explaining a circuit pattern with a writing error formed on the mask M's plate 2, and is an illustration viewing the mask from a direction parallel to the mask M's pattern surface PM.

In FIG. 7, a point Po is an original position in the pattern surface PM (according to the design value) at a certain point in the electronic circuit pattern on the mask M's plate 2, indicating that this point in the electronic circuit pattern is written without any writing error. The point Pr is a position of a certain point in the electronic circuit pattern actually written on the pattern surface PM of the plate 2 by the electron beam lithography method, the position corresponding to the designed point Po.

Δ is a difference (distance) between the points Pr and Po in the pattern surface PM, which corresponds to the writing error in the pattern.

Assuming that a distance between the pattern surface PM and the plane of incidence AS of the transparent member 1 is Dr, the thickness of the transparent member 1 is Dp, and the refractive index of the transparent member 1's material is n, a method for determining a shape for the curved surface AS is the same as correcting various aberrations due to the above transparent member 1's transformation by its own weight.

Namely, the difference Δ is expressed as follows where a tilt of the surface AS is δ:

$$\Delta = Dr \times \delta (1-n) \quad (1a)$$

The angle of the plane is set such that at the point of exit Pout of a beam, the angle θ of the beam meets the following equation:

$$\theta = \Delta/(Dr + Dp) \quad (2a)$$

Thus, an angle X that satisfies the following formula may be calculated:

$$n \cdot \theta = \delta + X \quad (3a)$$

Based on the angle X thus found, aspheric process is performed for the surface AS.

In the fourth embodiment, when a beam that exited from the point Pr of the pattern surface PM exits from the plane of exit BS of the transparent plate 1, the tilt at the point Pi on the surface AS is set as if it had exited from the point Po of the pattern surface PM. Namely, the surface AS is processed such that the point Po is positioned on the extended line of the beam LF exiting from the surface BS. Such a surface process is equally performed for each pattern point other than the point Pr written on the pattern surface PM. Namely, the tilt of each part on the plane of incidence of light AS of the transparent member 1 is set such that a beam exiting from each point in the pattern makes its way in the direction as if exiting from its original position (design position).

The transparent plate at the pattern surface PM side of the mask M in the above embodiments has a main object of dustproof, but for a mask and reticle onto which a transparent member, whose main object is aberration correction apart from dustproof, is mounted on its pattern surface PM side via a supporting frame, the present invention is applicable.

A description will be given below of a semiconductor device fabrication method utilizing the mask and projection exposure apparatus according to the present invention.

Figure 8:
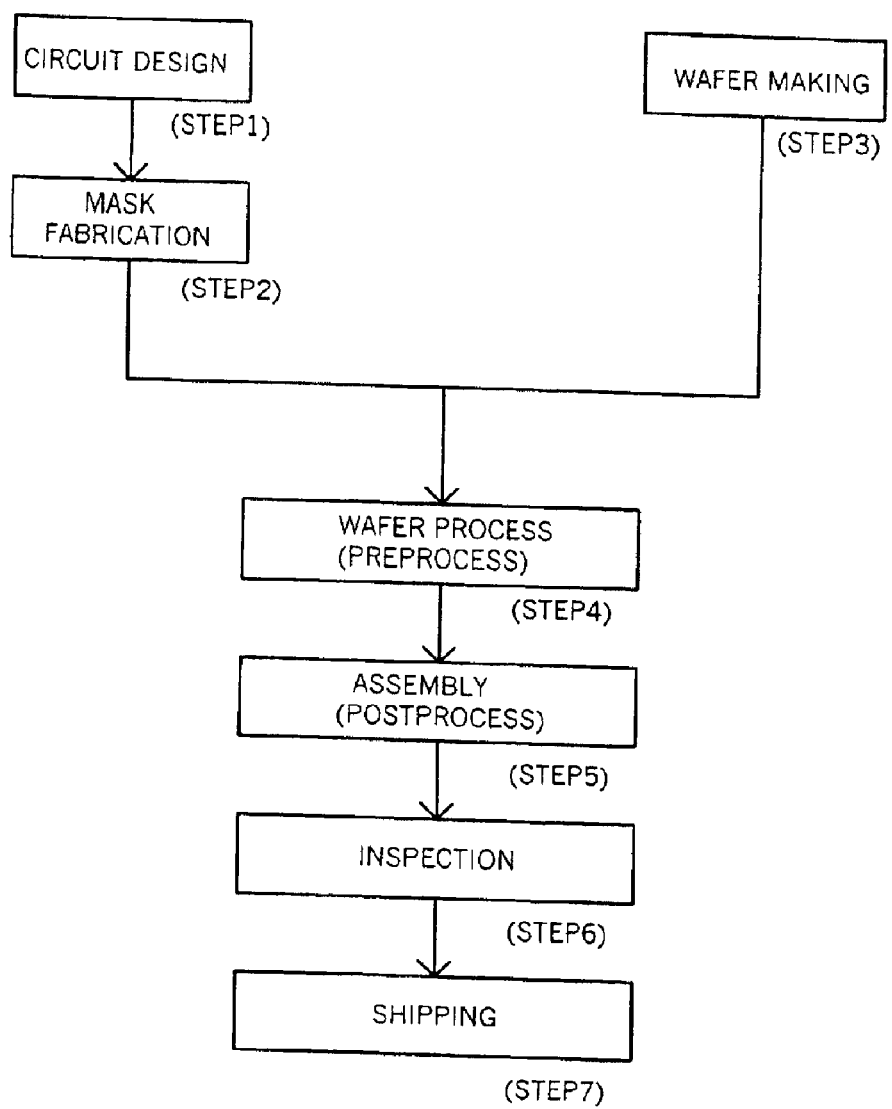
FIG. 8 is a flowchart for a device fabrication method according to the present invention.

FIG. 8 is a flowchart for the present invention's fabrication method for devices (semiconductor chips such as ICs and LSI, liquid crystal panels, CCDs, and the like). A description will be given thereof. Step 1 (circuit design) designs a semiconductor device circuit. Step 2 (mask fabrication) forms a mask having a designed circuit pattern. On the other hand, Step 3 (wafer making) manufactures a wafer using materials such as silicon. Step 4 (wafer process), which is referred to as a pretreatment, forms actual circuitry on the wafer through lithography using the mask (reticle) 3 and wafer 7 prepared as above, and projection lenses of this invention. Step 5 (assembly), which is also referred to as a posttreatment, forms into a semiconductor chip the wafer formed in Step 4 and includes an assembly step (e.g., dicing, bonding), a packaging step (chip sealing) and the like. Step 6 (inspection) performs various tests for the semiconductor device made in Step 5, such as a validity test and a durability test. Through these steps, a semiconductor device is finished and shipped (Step 7).

Figure 9:
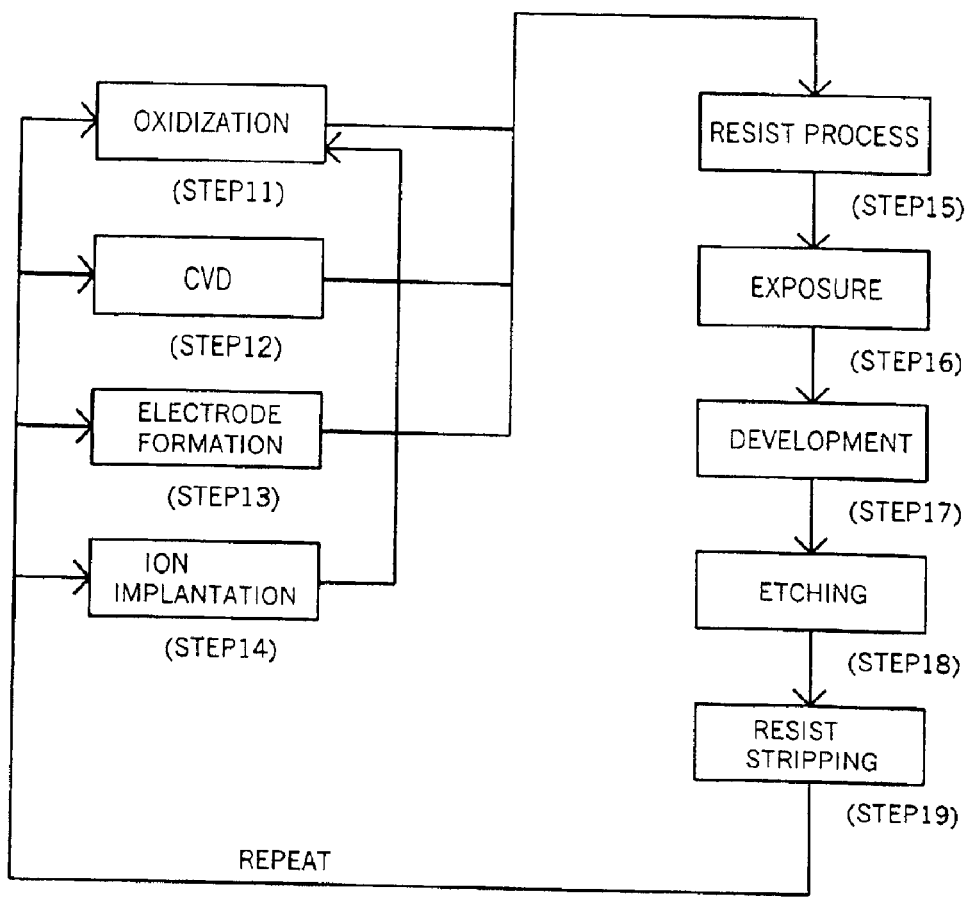
FIG. 9 is a flowchart for a wafer process shown in FIG. 8.

FIG. 9 is a detailed flowchart of the wafer process in Step 4. Step 11 (oxidation) oxidizes wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the projection exposure apparatus of the present invention to expose a circuit pattern on the reticle onto the wafer. Step 17 (development) develops the exposed wafer. Step 18 (etching) etches parts other than the developed resist image. Step 19 (resist stripping) removes disused resist after etching. These steps are repeated, and multi-layer circuit patterns are formed on the wafer.

Use of the fabrication method of the instant embodiments facilitates a fabrication of highly integrated semiconductor devices.

As described above, the present invention provides a mask and a projection exposure apparatus that may effectively prevent or decrease a deterioration of image quality (quality of a circuit pattern image) based on a transformation of the dustproof transparent members and circuit pattern writing errors.

What is claimed is:

1. A projection exposure apparatus comprising;
   i) a mask stage for installing a mask, the mask including:

a) a substrate that has a pattern on one surface of the substrate b) a transparent member provided at the side of the one surface of the substrate; and c) a thin film that is adhered to said transparent member, and has an aspheric surface;

ii) an illumination optical system for illuminating the mask; and iii) a projection optical system for projecting the pattern on the mask illuminated by said illumination optical system, said mask stage and said illumination and projection optical systems being configured such that the pattern on the mask may be projected.

2. A projection exposure apparatus according to claim 1, wherein said illumination optical system uses light having a wavelength of 200 nm or smaller to illuminate the mask.

3. A projection exposure apparatus according to claim 2, wherein the light is fed from an ArF or $F_2$ excimer laser unit.

4. A projection exposure apparatus according to claim 1, further comprising a mechanism for adjusting a symmetrical distortion of said projection optical system.

5. A projection exposure apparatus according to claim 1, further comprising a mechanism for adjusting a spherical aberration of said projection optical system.

6. A projection exposure apparatus according to claim 5, wherein the adjusting mechanism reduces a spherical aberration due to the transparent member.

7. A projection exposure apparatus according to claim 1, wherein said projection optical system is a telecentric optical system at both object and image sides.

8. A projection exposure apparatus according to claim 1, wherein said transparent member has a dustproof function.

9. A projection exposure apparatus according to claim 1, wherein said thin film is formed by vacuum evaporation.

10. A projection exposure apparatus according to claim 1, wherein said correction part is formed such that a ray emits to a proper optical path from each portion in the pattern.

11. A projection exposure apparatus according to claim 1, wherein the correction part is formed such that a distortion of an image of the pattern is reduced when the image of the pattern is projected by a projection optical system in an exposure apparatus when said mask is installed into the exposure apparatus.

12. A projection exposure apparatus comprising a projection optical system for projecting, onto an object to be exposed, a pattern formed on a surface of a mask that includes, at a side of the surface, a transparent member and a correction part for reducing an error of an image of the pattern projected on the object caused by errors in the pattern, and
   wherein said correction part includes a thin film that is adhered to said transparent member, and has an aspheric surface.

13. A projection exposure apparatus comprising a projection optical system for projecting, onto an object to be exposed, a pattern formed on a surface of a mask that includes, at a side of the surface, a transparent member and a correction part that has an aspheric surface for reducing a fluctuation of an optical path of light from the pattern to the object, the fluctuation being caused by a deformation of the transparent member, and
   wherein said correction part includes a thin film that is adhered to said transparent member, and has an aspheric surface.

14. A projection exposure apparatus comprising a projection optical system for projecting, onto an object to be exposed, a pattern formed on a surface of a mask that includes, at a side of the surface, a transparent member and a correction part that has an aspheric surface at least one of incident and exit planes, the aspheric surface for reducing an error of an image of the pattern projected on the object caused by errors in the pattern and/or for reducing a fluctuation of an optical path of light from the pattern to the object, the fluctuation being caused by a deformation of the transparent member, and wherein said correction part includes a thin film that is adhered to said transparent member, and has an aspheric surface.

15. A device fabrication method comprising the steps of:

projecting a pattern on a mask onto a wafer by using a projection exposure apparatus; and developing said wafer to which said pattern was transferred;

wherein said projection exposure apparatus includes:

a mask stage for installing the mask, the mask including a substrate that has a pattern on one surface of the substrate, a transparent member provided at the side of the one surface of the substrate, and a thin film that is adhered to said transparent member, and has an aspheric surface;

an illumination optical system for illuminating the mask; and a projection optical system for projecting the pattern on the mask illuminated by said illumination optical system, said mask stage and said illumination and projection optical systems being configured such that the pattern on the mask may be projected.

16. A device fabrication method comprising the steps of:

projecting a pattern on a mask onto a wafer by using a projection exposure apparatus; and developing said wafer to which said pattern was transferred;

wherein said projection exposure apparatus includes a projection optical system for projecting, onto an object to be exposed, a pattern formed on a surface of a mask that includes, at a side of the surface, a transparent member and a correction part for reducing an error of an image of the pattern projected on the object caused by errors in the pattern, and wherein said correction part includes a thin film that is adhered to said transparent member, and has an aspheric surface.

17. A device fabrication method comprising the steps of:

projecting a pattern on a mask onto a wafer by using a projection exposure apparatus; and developing said wafer to which said pattern was transferred;

wherein said projection exposure apparatus includes a projection optical system for projecting, onto an object to be exposed, a pattern formed on a surface of a mask that includes, at a side of the surface, a transparent member and a correction part that has an aspheric surface for reducing a fluctuation of an optical path of light from the pattern to the object, the fluctuation being caused by a deformation of the transparent member, and wherein said correction part includes a thin film that is adhered to said transparent member and, has an aspheric surface.

18. A device fabrication method comprising the steps of:

projecting a pattern on a mask onto a wafer by using a projection exposure apparatus; and developing said wafer to which said pattern was transferred;

wherein said projection exposure apparatus includes a projection optical system for projecting, onto an object to be exposed, a pattern formed on a surface of a mask that includes, at a side of the surface, a transparent member and a correction part that has an aspheric surface at least one of incident and exit planes, the aspheric surface for reducing an error of an image of the pattern projected on the object caused by errors in the pattern and/or for reducing a fluctuation of an optical path of light from the pattern to the object, the fluctuation being caused by a deformation of the transparent member, and wherein said correction part includes a thin film that is adhered to said transparent member, and has an aspheric surface.

* * * * *